(12) United States Patent
Brady et al.

(10) Patent No.: US 6,271,793 B1
(45) Date of Patent: Aug. 7, 2001

(54) RADIO FREQUENCY (RF) TRANSPONDER (TAG) WITH COMPOSITE ANTENNA

(75) Inventors: Michael John Brady, Brewster, NY (US); Ravi Saraf, Blacksburg, VA (US); Judy Rubino, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,172

(22) Filed: Nov. 5, 1999

(51) Int. Cl.[7] ....................................................... H01Q 1/38
(52) U.S. Cl. .................... 343/700 MS; 343/873; 29/600; 257/673
(58) Field of Search ............................. 343/700 MS, 873; 29/600; 257/673, 666, 674, 735, 737; H01Q 1/38

(56) References Cited

U.S. PATENT DOCUMENTS

| | | | |
|---|---|---|---|
| 5,528,222 | * 6/1996 | Moskowitz et al. | 340/572 |
| 5,600,342 | * 2/1997 | Pikulski et al. | 343/909 |
| 5,682,143 | * 10/1997 | Brady | 343/793 |
| 5,786,626 | * 7/1998 | Brady et al. | 257/673 |
| 5,990,850 | * 11/1999 | Brown et al. | 343/909 |

\* cited by examiner

*Primary Examiner*—Hoanganh Le
(74) *Attorney, Agent, or Firm*—Louis J. Percello

(57) ABSTRACT

An antenna composed of composite material which can be screen printed is proposed for RFID transponders and other RF communication systems.

19 Claims, 2 Drawing Sheets

RADIO FREQUENCY (RF) TRANSPONDER (TAG) WITH COMPOSITE ANTENNA

RELATED PATENTS AND APPLICATIONS

Related U.S. Patents assigned to the assignee of the present invention include: U.S. Pat. No. 5,866,044, which is a continuation of application Ser. No. 08/2339,609, filed Nov. 15, 1994 (now abandoned). Other U.S. Pat. Nos. include: 5,521,601; 5,528,222; 5,538,803; 5,550,547; 5,552, 778; 5,554,974; 5,563,583; 5,565,847; 5,606,323; 5,635, 693; 5,673,037; 5,680,106; 5,682,143; 5,729,201; 5,729, 697; 5,736,929; 5,739,754; 5,767,789; 5,777,561; 5,786, 626; 5,812,065; 5,821,859; 5,828,318; 5,831,532; 5,850, 181; 5,874,902; 5,889,489; 5,909,176; and 5,912,632. U.S. patent applications assigned to the assignee of the present invention include: application Ser. No. 099/119,569, filed Jul. 20, 1998, which is a division of 08/1734,492 (now U.S. Pat. No. 5,866,044. The above identified U.S. Patents and U.S. Patent applications are hereby incorporated by reference.

FIELD OF THE INVENTION

The field of the invention is the field of Radio Frequency (RF) transponders (RF Tags) which receive RF electromagnetic radiation from a base station and send information to the base station by modulating the load of an RF antenna.

BACKGROUND OF THE INVENTION

RF Tags can be used in a multiplicity of ways for locating and identifying accompanying objects, items, animals, and people, whether these objects, items, animals, and people are stationary or mobile, and transmitting information about the state of the of the objects, items, animals, and people. It has been known since the early 60's in U.S. Pat. No. 3,098,971 by R. M. Richardson, that electronic components on a transponder could be powered by radio frequency (RF) power sent by a "base station" at a carrier frequency and received by an antenna on the tag. The signal picked up by the tag antenna induces an alternating current in the antenna which can be rectified by an RF diode and the rectified current can be used for a power supply for the electronic components. The tag antenna loading is changed by something that was to be measured, for example a microphone resistance in the cited patent. The oscillating current induced in the tag antenna from the incoming RF energy would thus be changed, and the change in the oscillating current led to a change in the RF power radiated from the tag antenna. This change in the radiated power from the tag antenna could be picked up by the base station antenna and thus the microphone would in effect broadcast power without itself having a self contained power supply. In the cited patent, the antenna current also oscillates at a harmonic of the carrier frequency because the diode current contains a doubled frequency component, and this frequency can be picked up and sorted out from the carrier frequency much more easily than if it were merely reflected. Since this type of tag carries no power supply of its own, it is called a "passive" tag to distinguish it from an active tag containing a battery. The battery supplies energy to run the active tag electronics, but not to broadcast the information from the tag antenna. An active tag also changes the loading on the tag antenna for the purpose of transmitting information to the base station.

The "rebroadcast" or "reflection" of the incoming RF energy at the carrier frequency is conventionally called "back scattering", even though the tag broadcasts the energy in a pattern determined solely by the tag antenna and most of the energy may not be directed "back" to the transmitting antenna.

In the 70's, suggestions to use tags with logic and read/write memories were made. In this way, the tag could not only be used to measure some characteristic, for example the temperature of an animal in U.S. Pat. No. 4,075,632 to Baldwin et. al., but could also identify the animal. The antenna load was changed by use of a transistor. A transistor switch also changed the loading of the transponder in U.S. Pat. No. 4,786,907 by A. Koelle.

Prior art tags have used electronic logic and memory circuits and receiver circuits and modulator circuits for receiving information from the base station and for sending information from the tag to the base station.

The continuing march of semiconductor technology to smaller, faster, and less power hungry has allowed enormous increases of function and enormous drop of cost of such tags. Presently available research and development technology will also allow new function and different products in communications technology.

A fundamental problem with RF tags is that the cost of the tag must be reduced to a level small compared to the cost of the product to which the tag is attached, which would then allow many more tags to be used and so that high volume production can cut the costs even further. The cost of the tags is the cost of the semiconductor chip, the antenna, the substrate supporting the antenna and chip, and the attachment cost. The present invention lowers the cost and increases the function of the antenna attached to the substrate.

OBJECTS OF THE INVENTION

It is an object of the invention to produce an RF transponder comprising components which can be made at low cost. It is a further object of the invention to provide an RF transponder comprising a flexible antenna and substrate. It is a further object of the invention to provide an RF transponder which can be made by screen printing techniques. It is a further object of the invention to provide an RF transponder having enhanced environmental resistance. It is a further object of the invention to provide an RF transponder in a thin package. It is a further object of the invention to provide an RF transponder antenna which may easily be electrically connected to a semiconductor chip.

SUMMARY OF THE INVENTION

The present invention is an RF antenna made from a composite material, wherein the composite material preferably comprises electrically conducting particles in a matrix, and wherein the electrically conducting particles have such a high density that the electrical conductivity of the composite material is large enough for the antenna to receive RF signals sufficient to activate the RF tag.

DETAILED DESCRIPTION OF THE INVENTION

Figure 1:
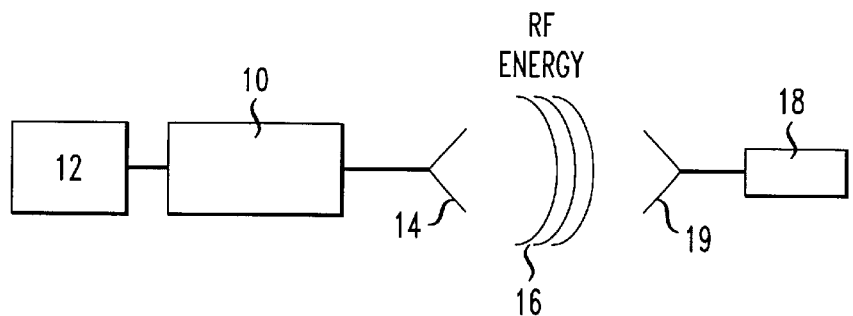
FIG. 1 is a sketch of a prior art RFID tag and base station.

FIG. 1 shows a prior art RF identification (RFID) system where a base station 10 controlled by a computer 12 sends RF energy to an antenna 14 which broadcasts the RF energy 16 to an RF tag 18 through an antenna 19.

Figure 2:
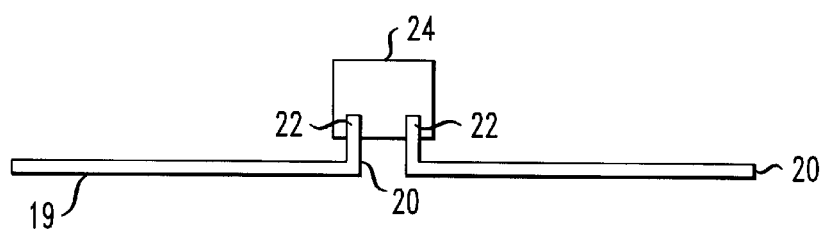
FIG. 2 is a sketch of a plan view of an embodiment of the invention.

FIG. 2 shows a plan view of the apparatus of the invention. Electrical circuitry 24 is connected to an antenna 19, which is made of a material 20 which is a composite material, preferably a composite of a large number of small electrically conducting particles in a matrix. The composite material is connected to electrical circuitry 24 at points 22. Composite material 20 is most preferably silver powder mixed in a thermoplastic matrix. Composite material's 20 matrix is preferably an elastomeric polymer and/or a thermoplastic material. The antenna 19 is preferably made by screening a paste of metal powder, polymer material, and solvent through a screen on to a substrate (shown later). While the paste is still wet, the electrical circuitry 24 is preferably mechanically and electrically bonded to the material 20 of the invention by contacting electrical contacts of the electrical circuitry 24 with the wet paste, and then driving off the solvent and/or curing the polymer matrix material. Surprisingly, material 20 of the invention may have sufficiently low electrical resistance that the apparatus of FIG. 2 works as an RFID tag with only slightly reduced read distance from an RFID tag with an antenna made from conventional copper. Conventional wisdom in the antenna art dictates that the antenna material has as low a resistivity as possible. The material 20 has preferably 30% by volume electrically conducting powder mixed in with the matrix material. With the most preferred material of the invention, the dried metal powder matrix material has a resistivity only 10 times that of solid copper which equals 1.7 micro-ohm-cm. It is important that the resistivity be as low as possible, preferably in the range from about 10 micro-ohm-cm to about 40 micro-ohm-cm. It is most preferably for the material to have a resistivity less than 20 micro-ohm-cm. Other conducting particle composite materials are preferably copper particles, copper particles covered with a silver film, and copper particles covered with a gold film. Other preferred composite materials 20 are composites of conducting polymers and elastomeric polymers.

With the material 20 of the invention, the steps of forming an antenna by stamping or etching solid metal electrical conductors, then joining the metal to the semiconductor chip are combined into the steps of screening paste and pressing the electrical circuit connections into the wet paste. This leads to an enormous decrease in the cost of the tags.

While FIGS. 1–8 show antennas as dipole antennas, all antennas as known in the art of RF communication are anticipated by the inventors, including but not limited to patch antennas, spiral antennas, horn antennas, reflector antennas, folded dipole antennas, and polarizing antennas.

Figure 3:
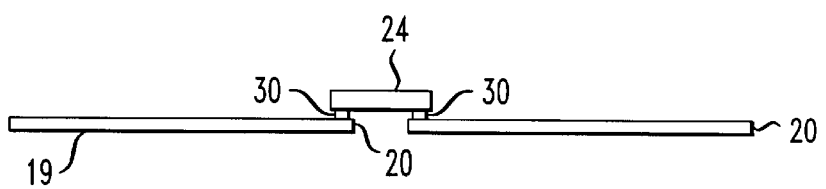
FIG. 3 is a sketch of an elevation view of an embodiment of the invention.

FIG. 3 shows an elevation view of the apparatus of the invention. Material 20 is shown electrically contacting an electrically conducting material 30 which is electrical contact with electrical circuitry 24. Electrical circuitry 24 is most preferably a single semiconductor chip. Electrically conducting material 30 may be a pad on the chip, a bump on the chip or another means as known in the art to make contact to a chip. Material 20 is most preferably screen printed on to a substrate (shown later). The formed antenna 19 may be stripped off the screen printed substrate after curing, or may most preferably be left on the substrate.

Figure 4:
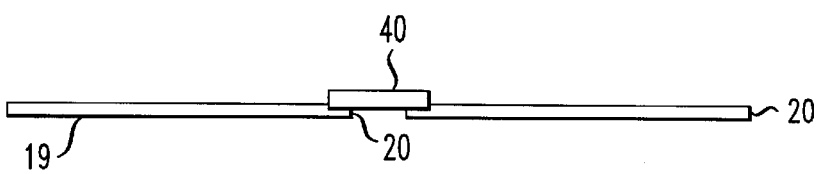
FIG. 4 is a sketch of an elevation view of an embodiment of the invention.

FIG. 4 shows the material 20 of the invention directly contacting electrical contacts of the a chip 40 so that the chip 40 is both mechanically connected to and electrically connected to the material 20 of the antenna 19.

Figure 5:
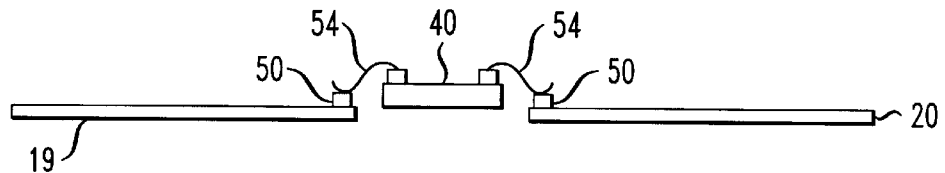
FIG. 5 is a sketch of an elevation view of an embodiment of the invention.

FIG. 5 shows the material 20 of the invention connected to an electrically conducting pad 50 which is wire bonded with wire 54 to chip 40 through a conducting pad or bump 52 on the chip 40.

Figure 6:
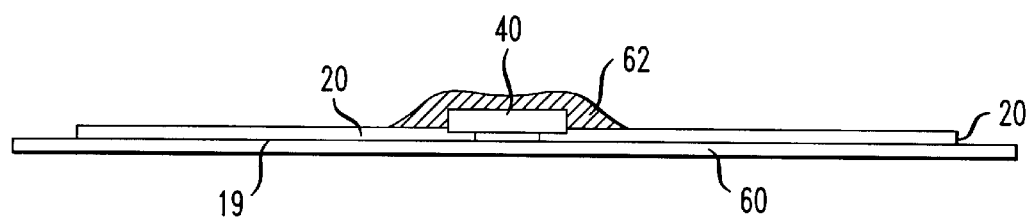
FIG. 6 is a sketch of an elevation view of an embodiment of the invention.

FIG. 6 shows the antenna of the invention supported by a substrate 60, and also shows that the chip 40 is encapsulated with encapsulant 62. The substrate 60 and the encapsulant 62 protect the chip from the environment. The substrate 60 is formed from epoxy-glass printed circuit board or from a polymer such as polyimide, polyethylene terphalate (PET), mylar, polyester, pollycarbonate, or other substrates as are known in the art. In particular, the substrate 60 and the material 20 of the antenna may be elastic so that the system is flexible.

Figure 7:
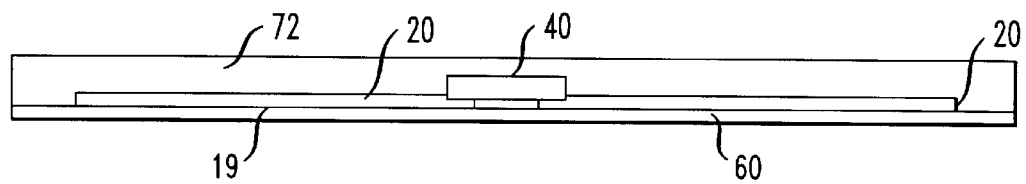
FIG. 7 is a sketch of an elevation view of an embodiment of the invention.

FIG. 7 shows the material of the invention and the chip protected by the environment by a layer 72 which is sealed to substrate 60 and which covers material 20 and chip 40 completely. Material for layer 72 is advantageously EVA (Ethylene vinyl acetate), which adheres well with PET and is used extensively in the food industry.

Figure 8:
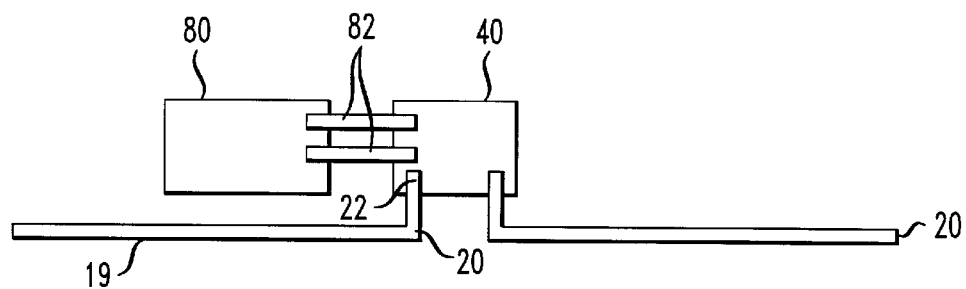
FIG. 8 is a sketch of a plan view of an embodiment of the invention.

FIG. 8 shows a plan view of the invention, where battery 80 is attached to chip 40 by electrical connections 82. Electrical connections 82 are preferably made of the same material 20 as antenna 19, and are bonded at the same time that chip 40 and material 20 are bonded together. A suitable battery is a thin film battery comprising $MnO_2$, Lithium foil, and a polymer electrolyte (PAN) with a thickness of 14 mils. The apparatus of the invention may also comprise a passive RFID tag.

Obviously, many modifications and variations of the present invention are possible in light of the above teachings. It is therefore to be understood that, within the scope of the appended claims, the invention may be practiced otherwise than as specifically described.

We claim:

1. An apparatus comprising:
   electrical circuitry; and
   an antenna electrically connected with the electrical circuitry, the antenna for communicating radio frequency signals with a base station, the antenna comprising:
   a composite material comprising electrically conducting particles mixed in a polymer material, wherein the composite material has a resistivity having a predetermined value low enough that the radio frequency signals activate the electrical circuitry.

2. The apparatus of claim 1, wherein the electrical circuitry comprises a semiconductor chip.

3. The apparatus of claim 2, wherein the semiconductor chip comprises electrically conducting pads which are in direct electrical contact to the composite material.

4. The apparatus of claim 2, wherein the semiconductor chip comprises electrically conducting pads which are in wire bonded electrical contact to the composite material.

5. The apparatus of claim 2, wherein the semiconductor chip comprises electrically conducting pads which are in wire bonded electrical contact to a metal pad which is in direct electrical contact with the composite material.

6. The apparatus of claim 2, wherein the semiconductor chip comprises metal bumps which are in direct electrical contact to the composite material.

7. The apparatus of claim 1, wherein the electrically conducting particles are metal.

8. The apparatus of claim 7, wherein the electrically conducting particles are silver.

9. The apparatus of claim 7, wherein the electrically conducting particles are copper coated with silver.

10. The apparatus of claim 7, wherein the electrically conducting particles are copper coated with gold.

11. The apparatus of claim 1, wherein the polymer material is an elastomer.

12. The apparatus of claim 1, wherein the polymer material is thermoplastic.

13. The apparatus of claim 12, wherein the electrically conductive particles occupy at least 30% by volume of the composite material.

14. The apparatus of claim 1, wherein the electrically conducting particles are electrically conducting polymeric particles.

15. The apparatus of claim 1, wherein the resistivity of the composite material is in the range from about 10 micro-ohm-cm to about 40 micro-ohm-cm.

16. The apparatus of claim 1, wherein the antenna is flexible.

17. The apparatus of claim 1, wherein the antenna and the electrical circuitry are attached to a substrate.

18. The apparatus of claim 17, wherein the substrate is a flexible substrate.

19. The apparatus of claim 17, further comprising a battery electrically attached to the electrical circuitry.

* * * * *